United States Patent
Park et al.

(10) Patent No.: US 10,511,281 B2
(45) Date of Patent: Dec. 17, 2019

(54) ACOUSTIC WAVE RESONATOR AND FILTER INCLUDING THE SAME

(71) Applicant: SAMSUNG ELECTRO-MECHANICS CO., LTD., Suwon-si (KR)

(72) Inventors: Ho Soo Park, Suwon-si (KR); Jea Shik Shin, Suwon-si (KR); Sang Uk Son, Suwon-si (KR); Yeong Gyu Lee, Suwon-si (KR); Moon Chul Lee, Suwon-si (KR); Duck Hwan Kim, Suwon-si (KR); Chul Soo Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 305 days.

(21) Appl. No.: 15/232,116

(22) Filed: Aug. 9, 2016

(65) Prior Publication Data
US 2017/0077898 A1  Mar. 16, 2017

(30) Foreign Application Priority Data
Sep. 11, 2015 (KR) .......... 10-2015-0128940

(51) Int. Cl.
    *H03H 9/05* (2006.01)
(52) U.S. Cl.
    CPC ............... *H03H 9/0504* (2013.01)
(58) Field of Classification Search
    CPC .. H03H 9/0504; H03H 9/0571; H03H 9/1014; H03H 9/1071; H03H 9/173; H01L 41/053
    USPC ................................. 310/344, 348
    See application file for complete search history.

(56) References Cited

U.S. PATENT DOCUMENTS

| 7,301,260 B2 | 11/2007 | Kawakubo |
| 2005/0167854 A1 | 8/2005 | Tikka et al. |
| 2008/0081398 A1 | 4/2008 | Lee et al. |
| 2011/0090651 A1* | 4/2011 | Jung ............ H03H 9/0514 361/748 |

(Continued)

FOREIGN PATENT DOCUMENTS

| CN | 104067515 A | 9/2014 |
| EP | 0 637 871 A1 | 2/1995 |
| JP | 7-38015 A | 2/1995 |

(Continued)

OTHER PUBLICATIONS

Chinese Office Action dated Sep. 3, 2018 in corresponding Chinese Patent Application No. 201610811315.3 (14 pages in English and 10 pages in Chinese).

*Primary Examiner* — Derek J Rosenau
(74) *Attorney, Agent, or Firm* — NSIP Law

(57) ABSTRACT

An acoustic wave resonator includes a substrate; a resonating part disposed on a first surface of the substrate and including a first electrode, a piezoelectric layer, and a second electrode; and a cap disposed on the first surface of the substrate and including an accommodating part accommodating the resonating part. The resonating part is configured to be operated by either one or both of a signal output from a first device substrate disposed facing a second surface of the substrate on an opposite side of the substrate from the first surface of the substrate and a signal output from a second device substrate disposed on the cap.

16 Claims, 4 Drawing Sheets

(56) References Cited

U.S. PATENT DOCUMENTS

2012/0049976 A1* 3/2012 Son .................. H03H 3/04
333/133
2014/0333391 A1 11/2014 Tsuda

FOREIGN PATENT DOCUMENTS

KR 10-2015-0003507 A 1/2015
WO WO 2013/128541 A1 9/2013

* cited by examiner

ACOUSTIC WAVE RESONATOR AND FILTER INCLUDING THE SAME

CROSS-REFERENCE TO RELATED APPLICATION(S)

This application claims the benefit under 35 USC 119(a) of Korean Patent Application No. 10-2015-0128940 filed on Sep. 11, 2015, in the Korean Intellectual Property office, the entire disclosure of which is incorporated herein by reference for all purposes.

BACKGROUND

1. Field

This application relates to an acoustic wave resonator and a filter including the same.

2. Description of Related Art

In accordance with a rapid increase in the development of mobile communications devices, chemical devices, and biological devices, the demand for compact and lightweight filters, oscillators, resonant elements, and acoustic resonant mass sensors has also increased.

As a means for implementing the compact and lightweight filters, oscillators, resonant elements, and acoustic resonant mass sensors, a film bulk acoustic resonator (hereinafter referred to as "FBAR") is well known in the art. The FBAR has an advantage in that it may be mass produced at a minimal cost and may be subminiaturized. Further, the FBAR has advantages in that it may have a high value of a quality factor Q, which is a main property of a filter, may be used even in a microwave frequency band, and may operate at frequencies up to bands of a personal communications system (PCS) and a digital cordless system (DCS).

Generally, the FBAR has a structure including a resonating part made by sequentially stacking a first electrode, a piezoelectric layer, and a second electrode on a substrate.

An operation principle of the FBAR will be described below. First, when an electrical field is induced in the piezoelectric layer by applying electric energy to the first and second electrodes, the electrical field produces a piezoelectric phenomenon in the piezoelectric layer, thereby causing the resonating part to vibrate in a predetermined direction. As a result, a bulk acoustic wave is generated in the same direction as the vibration direction of the resonating part, thereby causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave resonator includes a substrate; a resonating part disposed on a first surface of the substrate and including a first electrode, a piezoelectric layer, and a second electrode; and a cap disposed on the first surface of the substrate and including an accommodating part accommodating the resonating part; wherein the resonating part is configured to be operated by either one or both of a signal output from a first device substrate disposed facing a second surface of the substrate on an opposite side of the substrate from the first surface of the substrate and a signal output from a second device substrate disposed on the cap.

The acoustic wave resonator may further include a first connection pattern disposed on an inner surface of a first via hole penetrating through the substrate in a thickness direction of the substrate, the first connection pattern being connected to the first electrode; a second connection pattern disposed on an inner surface of a second via hole penetrating through the substrate in the thickness direction of the substrate, the second connection pattern being connected to the second electrode; a first substrate connection pad disposed on the second surface of the substrate and connected to the first connection pattern; and a second substrate connection pad disposed on the second surface of the substrate and connected to the second connection pattern.

The first device substrate may be connected to the first substrate connection pad and the second substrate connection pad; and the resonating part may be further configured to be operated by a signal out from the first device substrate to either one or both of the first substrate connection pad and the second substrate connection pad.

The acoustic wave resonator may further include a first connection electrode penetrating through the accommodating part and connected to the first electrode; a second connection electrode penetrating through the accommodating part and connected to the second electrode; a first cap connection pad disposed on an outer surface of the cap and connected to the first connection electrode; and a second cap connection pad disposed on the outer surface of the cap and connected to the second connection electrode.

The second device substrate may be connected to the first cap connection pad and the second cap connection pad; and the resonating part may be further configured to be operated by a signal output from the second device substrate to either one or both of the first cap connection pad and the second cap connection pad.

The first connection electrode may be directly connected to the first connection pattern; and the second connection electrode may be directly connected to the second connection pattern.

The first cap connection pad, the first connection electrode, the first connection pattern, and the first substrate connection pad may form a first signal connection channel between the first device substrate and the second device substrate; and the second cap connection pad, the second connection electrode, the second connection pattern, and the second substrate connection pad may form a second signal connection channel between the first device substrate and the second device substrate.

In another general aspect, an acoustic wave resonator package includes a receiving acoustic wave resonator and a transmitting acoustic wave resonator each including a substrate; a resonating part disposed on a first surface of the substrate and including a first electrode, a piezoelectric layer, and a second electrode; a cap disposed on the first surface of the substrate and including an accommodating part accommodating the resonating part; and a substrate connection pad disposed on a second surface of the substrate on an opposite side of the substrate from the first surface of the substrate; wherein the transmitting acoustic wave resonator further may include a cap connection pad disposed on an outer surface of the cap; and the acoustic wave resonator package further includes a first device substrate having a first surface connected to the substrate connection pad of the receiving acoustic wave resonator, and a second surface connected to the cap connection pad of the transmitting acoustic wave resonator; and a second device substrate having a surface connected to the substrate connection pad of the transmitting acoustic wave resonator.

The receiving acoustic wave resonator is configured to be operated by a signal output from the first device substrate to the substrate connection pad of the receiving acoustic wave resonator.

The transmitting acoustic wave resonator is configured to be operated by either one or both of a signal output from the first device substrate to the cap connection pad of the transmitting acoustic wave acoustic resonator and a signal output from the second device substrate to the substrate connection pad of the transmitting acoustic wave acoustic resonator.

The transmitting acoustic wave resonator is configured to operate as a signal connection channel between the first device substrate and the second device substrate.

In another general aspect, an acoustic wave resonator includes a substrate; a resonating part disposed on a first surface of the substrate; a cap disposed on the first surface of the substrate and covering the resonating part; a substrate connection pad disposed on a second surface of the substrate on an opposite side of the substrate from the first surface of the substrate; and a first conductive path connecting the substrate connection pad to the resonating part.

The acoustic wave resonator may further include a cap connection pad disposed on a surface of the cap, the surface of the cap being parallel to the first surface of the substrate; and a second conductive path connecting the cap connection pad to the resonating part.

The resonating part may include a first electrode, a second electrode, and a piezoelectric element disposed between the first electrode and the second electrode; and the first conductive path may be connected to the first electrode or the second electrode.

The acoustic wave resonator may further include a cap connection pad disposed on a surface of the cap, the surface of the cap being parallel to the first surface of the substrate; and a second conductive path connecting the cap connection pad to a same one of the first electrode and the second electrode to which the first conductive path is connected.

The resonating part may be configured to resonate in response to either one or both of a first signal output from a first device substrate to the substrate connection pad and a second signal output from a second device substrate to the cap connection pad.

The first device substrate may be mounted on the substrate by a first bump between the substrate connection pad and the first device substrate; and the second device substrate may be mounted on the cap by a second bump between the cap connection pad and the second device substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
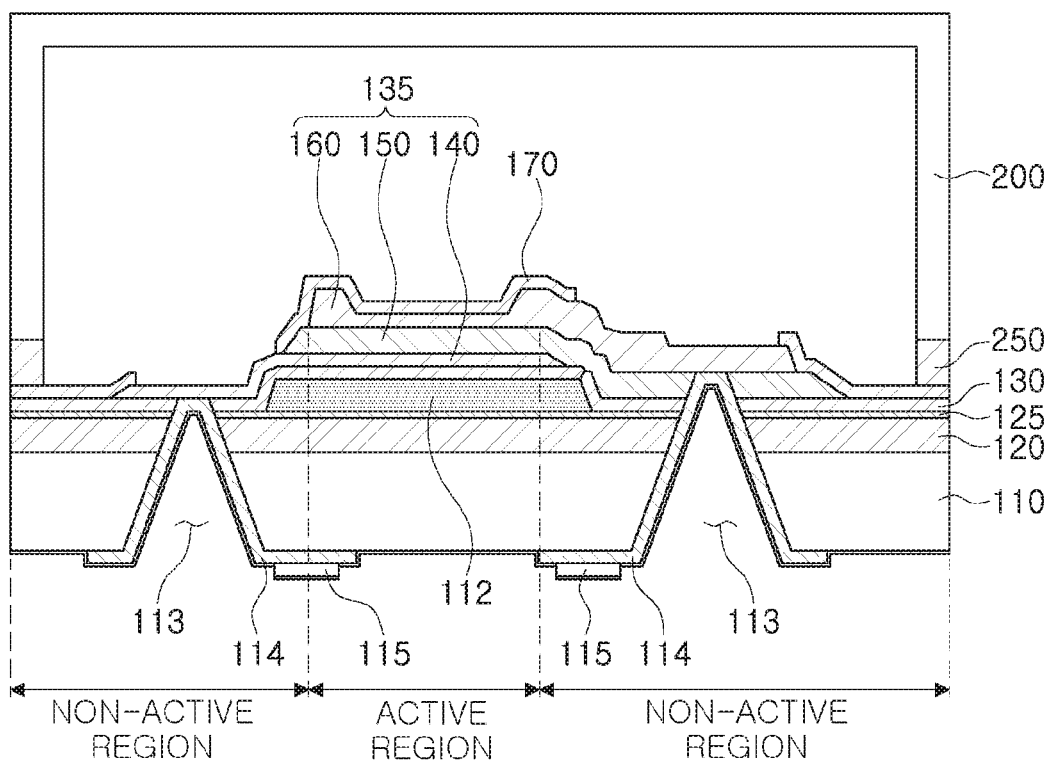
FIG. 1 is a cross-sectional view illustrating an example of an acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it is to be understood that when an element, such as a layer, region, or wafer (substrate), is referred to as being "on," "connected to," or "coupled to" another element, it may be directly "on," "connected to," or "coupled to" the other element, or other elements intervening therebetween may be present. In contrast, when an element is referred to as being "directly on," "directly connected to," or "directly coupled to" another element, other elements or layers intervening therebetween cannot be present. As used herein, the term "and/or" includes any and all combinations of one or more of the associated listed items.

Although terms such as "first," "second," and "third" may be used herein to describe various members, components, regions, layers, or sections, these members, components, regions, layers, or sections are not to be limited by these terms. These terms are only used to distinguish one member, component, region, layer, or section from another member, component, region, layer, or section. Thus, a first member, component, region, layer, or section discussed in examples below may also be referred to as a second member, component, region, layer, or section without departing from the teachings of the examples.

Spatially relative terms such as "above," "upper," "below," and "lower" may be used herein for ease of description to describe one element's relationship to one or more other elements as shown in the figures. It is to be understood that the spatially relative terms are intended to encompass different orientations of the device in use or operation in addition to the orientation depicted in the figures. For example, if the device in the figures is turned over, elements described as being "above" another element or being an "upper" element will then be "below" the other element or will be a "lower" element. Thus, the term "above" can encompass both the above and below orientations depending on a particular direction of the figures. The device may be also be oriented in other ways (for example, rotated 90 degrees or at other orientations) and the spatially relative descriptors used herein are to be interpreted accordingly.

The terminology used herein is for describing particular examples only, and is not to be used to limit the disclosure.

the present inventive concept. As used herein, the singular terms "a," "an," and "the" are intended to include the plural forms as well, unless the context clearly indicates otherwise. Also, as used herein, the terms "include," "comprise," and "have" specify the presence of stated features, numbers, operations, members, elements, and/or combinations thereof, but do not preclude the presence or addition of one or more other features, numbers, operations, members, elements, and/or combinations thereof.

Hereinafter, examples will be described with reference to schematic views illustrating the examples. In the drawings, due to manufacturing techniques and/or tolerances, for example, modifications of the shape shown may be estimated. Thus, the examples described herein are not to be construed as being limited to the particular shapes of regions shown herein, but are to be construed as including changes in shape occurring during manufacturing. The features of the examples described herein may be combined in various ways as will be apparent to one of ordinary skill in the art.

Although the examples described below have a variety of configurations, other configurations are possible as will be apparent to one of ordinary skill in the art.

FIG. 1 is a cross-sectional view illustrating an example of an acoustic wave resonator.

Referring to FIG. 1, an acoustic wave resonator 10 is a bulk acoustic wave resonator or a surface acoustic wave resonator. The acoustic wave resonator illustrated in FIG. 1 may be a resonator disposed at a reception (Rx) side.

Referring to FIG. 1, the acoustic wave resonator 10 includes a substrate 110, an insulating layer 120, an air cavity 112, and a resonating part 135.

The substrate 110 may be a typical silicon substrate, and the insulating layer 120 electrically insulates the resonating part 135 from the substrate 110 and is disposed on an upper surface of the substrate 110. The insulating layer 120 may be formed by depositing silicon dioxide ($SiO_2$) or aluminum oxide ($Al_2O_3$) on the substrate 110 by a chemical vapor deposition method, an RF magnetron sputtering method, or an evaporation method.

Two via holes 113 penetrating through the substrate 110 in a thickness direction of the substrate 110 are formed in a lower surface of the substrate 110. Connection patterns 114 are formed in the via holes 113. In the example in FIG. 1, the connection patterns 114 are formed on inner surfaces of the via holes 113, that is, on the entire inner walls of the via holes 113, but are not limited thereto.

The connection patterns 114 are manufactured by forming a conductive layer on the inner surfaces of the via holes 113. For example, the connection patterns 114 may be formed by depositing, coating, or providing a conductive metal such as gold or copper on the inner walls of the via holes 113.

One end of each of the connection patterns 114 is extended onto the lower surface of the substrate 110, and substrate connection pads 115 are formed on the portions of the connection patterns 114 extended onto the lower surface of the substrate 110. The other end of one of the connection patterns 114 is connected to a first electrode 140, and the other end of the other one of the connection patterns 114 is connected to a second electrode 160. One of the connection patterns 114 penetrates through the substrate 110, the insulating layer 120, an etching stop layer 125, and a membrane 130 and is electrically connected to the first electrode 140, and the other one of the connection patterns 114 penetrates through the substrate 110, the insulating layer 120, the etching stop layer 125, the membrane 130, and a piezoelectric layer 150 and is electrically connected to the second electrode 160. Thus, the connection patterns 114 electrically connect the first electrode 140 and the second electrode 160 to the substrate connection pads 115.

The substrate connection pads 115 may be electrically connected to an external substrate disposed below the substrate 110 through bumps. The acoustic wave resonator 10 filters a radio-frequency signal applied to the first and second electrodes 140 and 160 through the substrate connection pads 115.

Although FIG. 1 illustrates two via holes 113, two connection patterns 114, and two substrate connection pads 115, the number of via holes 113, connection patterns 114, and substrate connection pads 115 is not limited to two. Any number of via holes 113, connection patterns 114, and substrate connection pads 115 may be provided as needed.

The air cavity 112 is disposed above the insulating layer 120. The air cavity 112 is disposed below the resonating part 135 to enable the resonating part 135 to vibrate in a predetermined direction. The air cavity 112 may be formed by forming an air cavity sacrifice layer pattern on the insulating layer 120, forming the membrane 130 on the air cavity sacrifice layer pattern, and then etching and removing the air cavity sacrifice layer pattern.

The membrane 130 may serve as an oxidation protection layer, or may serve as a protection layer protecting the substrate 110.

The etching stop layer 125 is formed between the insulating layer 120 and the air cavity 112. The etching stop layer 125 protects the substrate 110 and the insulating layer 120 from an etching process, and serves as a base on which to deposit various other layers on the etching stop layer 125.

The resonating part 135 includes the first electrode 140, the piezoelectric layer 150, and the second electrode 160 stacked sequentially above the air cavity 112.

The first electrode 140 is formed on an upper surface of the membrane 130 to cover a portion of the membrane 130. The first electrode 140 may be formed of a typical conductive material such as a metal. For example, the first electrode 140 may be formed of gold (Au), titanium (Ti), tantalum (Ta), molybdenum (Mo), ruthenium (Ru), platinum (Pt), tungsten (W), aluminum (Al), or nickel (Ni).

The piezoelectric layer 150 is formed on an upper surface of the membrane 130 and the first electrode 140 to cover a portion of the membrane 130 and a portion of the first electrode 140. The piezoelectric layer 150, which is an element that generates a piezoelectric effect by converting electric energy into mechanical energy of an acoustic wave type, may be formed, for example, of aluminum nitride (AlN), zinc oxide (ZnO), lead zirconium titanium oxide (PZT or PbZrTiO), or any other piezoelectric material known to one of ordinary skill in the art.

The second electrode 160 is formed on the piezoelectric layer 150. Like the first electrode 140, the second electrode 160 is formed of a conductive material such as gold (Au), titanium (Ti), tantalum (Ta), molybdenum (Mo), ruthenium (Ru), platinum (Pt), tungsten (W), aluminum (Al), or nickel (Ni).

The resonating part 135 has active and non-active regions. The active region of the resonating part 135, which is a region that resonates by vibrating in a predetermined direction due to a piezoelectric phenomenon when electric energy such as a radio-frequency (RF) signal is applied to the first and second electrodes 140 and 160 to induce an electric field in the piezoelectric layer 150, is a region in which the first electrode 140, the piezoelectric layer 150, and the second electrode 160 overlap each other in a vertical direction over the air cavity 112. The non-active regions of the resonating part 135, which are regions that do not resonate due to the piezoelectric phenomenon even though the electric energy is applied to the first and second electrodes 140 and 160, are outer regions of the resonating part 135 outside the active region.

The resonating part 135 having the configuration as described above filters an RF signal having a specific frequency using the piezoelectric effect of the piezoelectric layer 150 described above. That is, an RF signal applied to the second electrode 160 is output in a direction of the first electrode 140 through the resonating part 135. In this case, since the resonating part 135 has a constant resonance frequency according to the vibration occurring in the piezoelectric layer 150, the resonating part 135 outputs only a signal matched to the resonance frequency of the resonating part 135 among the applied RF signal.

A protection layer 170 is disposed on the second electrode 160 of the resonating unit 135 to prevent the second electrode 160 from being exposed. The protection layer 170 may be formed of an insulating material. For example, the insulating material may be a silicon oxide-based material, a silicon nitride-based material, or an aluminum nitride-based material.

A cap 200 is bonded to the substrate 110 to protect the resonating part 135 from an external environment.

The cap 200 is formed in the shape of a cover including an internal space in which the resonating part 135 is accommodated. Specifically, the cap 200 has an accommodating part formed at a center thereof to accommodate the resonating part 135, and a frame of the cap 200 is formed to be stepped as compared to the accommodating part so as to be coupled to the resonator at an edge thereof. The frame is directly or indirectly bonded to the substrate 110 through a bonding agent 250 at a specific region. Although FIG. 1 illustrates a case in which the frame is bonded to the protection layer 170 disposed on the substrate 110, the frame may be bonded to any one or any combination of any two or more of the membrane 130, the etching stop layer 125, the insulating layer 120, and the substrate 110 by penetrating through the protection layer 170.

The cap 200 may be formed by a wafer bonding at a wafer level. That is, a substrate wafer on which a plurality of unit substrates 110 are disposed and a cap wafer on which a plurality of caps 200 are disposed may be bonded to each other to form an integral unit. The substrate wafer and the cap wafer that are bonded to each other are later cut by a cutting process to be divided into a plurality of the individual acoustic wave resonator illustrated in FIG. 1.

The cap 200 may be bonded to the substrate 110 by eutectic bonding. In this case, after the bonding agent 250, which may be eutectically bonded to the substrate 110, is deposited on the substrate 110, the substrate wafer and the cap wafer may be pressed together and heated to be bonded to each other.

The bonding agent 250 may include a eutectic material such as copper (Cu)-tin (Sn), and may also be a solder ball.

Figure 2:
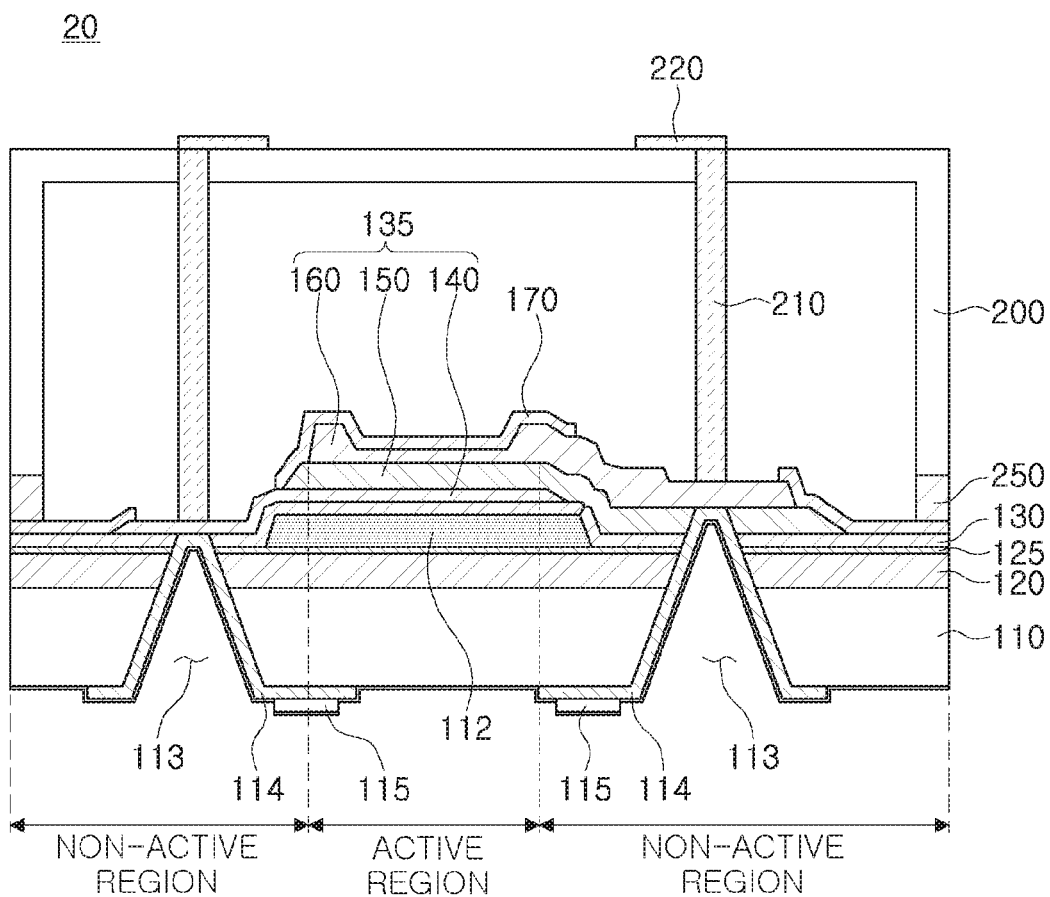
FIG. 2 is a cross-sectional view illustrating another example of an acoustic wave resonator.

FIG. 2 is a cross-sectional view illustrating another example of an acoustic wave resonator.

Referring to FIG. 2, an acoustic wave resonator 20 may be a bulk acoustic wave resonator or a surface acoustic wave resonator. The acoustic wave resonator illustrated in FIG. 2 may be a resonator disposed at a transmission (Tx) side.

Since the acoustic wave resonator 20 of FIG. 2 is similar to the acoustic wave resonator 10 of FIG. 1, an overlapping or like description thereof will be omitted, and a description will be provided in regard to a difference.

Comparing the acoustic wave resonator 20 illustrated in FIG. 2 to the acoustic wave resonator 10 illustrated in FIG. 1, a cap 200 of the acoustic wave resonator 20 illustrated in FIG. 2 includes two connection electrodes 210 and two cap connection pads 220 that are not included in the acoustic wave resonator 10 illustrated in FIG. 1.

The cap 200 includes two connection electrodes 210, and the connection electrodes 210 are formed to be approximately vertical by penetrating through the accommodating part of the cap 200. The connection electrodes 210 are extended from the accommodating part of the cap 200, and are connected to the first electrode 140 and the second electrode 160.

The connection electrodes 210 are connected to the cap connection pads 220, which are disposed on an outer surface of the cap 200. The cap connection pads 220 may be electrically connected to an external substrate disposed on the cap 200 through bumps.

The acoustic wave resonator 20 may be operated by signals applied through the substrate connection pads 115 and the connection patterns 114, as well as by signals applied through the cap connection pads 220 and the connection electrodes 210. That is, the resonating part 135 of the acoustic wave resonator 20 may be operated by the external substrate disposed below the substrate 110 and the external substrate disposed on the cap 200.

In this example, since the acoustic wave resonator 20 may be operated by the external substrate disposed below the substrate 110 and the external substrate disposed on the cap 200, this eliminates the need for a complicated circuit pattern connecting together different substrates disposed in a line on the same plane that is needed in the related art, and a number of components in a given a substrate area may be increased.

Although FIG. 2 illustrates a case in which the connection electrodes 210 are connected to the first electrode 140 and the second electrode 160, the connection electrodes 210 may be directly connected to the connection patterns 114 that are electrically connected to the first electrode 140 and the second electrode 160 by penetrating through the first electrode 140 and the second electrode 160. That is, the acoustic wave resonator 20 may be used for interconnecting the external substrate disposed on the cap 200 and the external substrate disposed below the substrate 110.

That is, the acoustic wave resonator 20 may transfer a signal output from an upper external substrate to a lower external substrate through the cap connection pads 220, the connection electrodes 210, the connection patterns 114, and the substrate connection pads 115. Conversely, the acoustic wave resonator 20 may transfer a signal output from the lower external substrate to the upper external substrate through the substrate connection pads 115, the connection patterns 114, the connection electrodes 210, and the cap connection pads 220.

Thus, the acoustic wave resonator 20 may be used as a signal connection channel between the external substrate disposed on the cap 200 and the external substrate disposed below the substrate 110, thereby eliminating the need for a connection pattern connecting the upper and lower substrates to each other.

Figure 3:
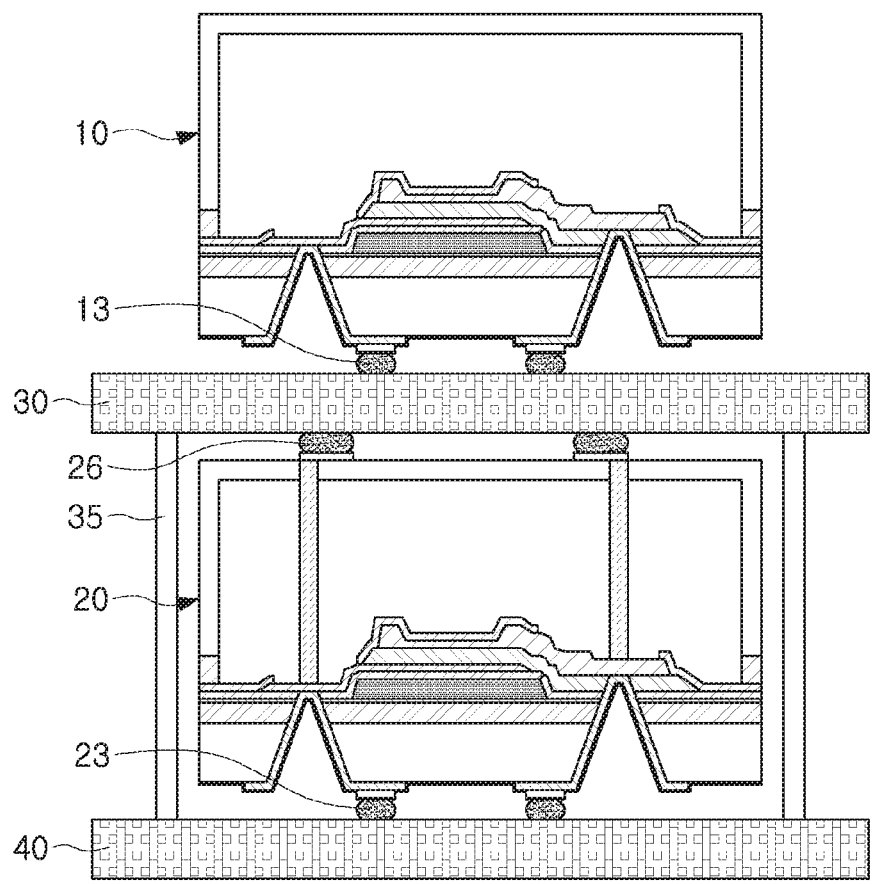
FIG. 3 is a view illustrating an example of an acoustic wave resonator package.

FIG. 3 is a view illustrating an example of an acoustic wave resonator package.

The acoustic wave resonator package includes a receiving acoustic wave resonator 10, a transmitting acoustic wave resonator 20, a first device substrate 30, a second device substrate 40, and two substrate connection electrodes 35.

The receiving acoustic wave resonator 10 corresponds to the acoustic wave resonator illustrated in FIG. 1 and the transmitting acoustic wave resonator 20 corresponds to the acoustic wave resonator illustrated in FIG. 2, so like or overlapping descriptions will be omitted.

The first and second device substrates 30 and 40 include a printed circuit board (PCB) and a ceramic board (for example, a low-temperature co-fired ceramic (LTCC) board or a high-temperature co-fired ceramic (HTCC) board). The first and second device substrates 30 and 40 are provided with a circuit pattern that is connected to bumps 13, 23, and 26. The substrate connection electrodes 35 function as pins interconnecting the first and second device substrates 30 and 40.

Referring to FIG. 3, the receiving acoustic wave resonator 10 is mounted on one surface of the first device substrate 30 through the bumps 13. The receiving acoustic wave resonator 10 may be operated by a signal output from the first device substrate 30.

The transmitting acoustic wave resonator 20 is mounted on one surface of the second device substrate 40 through the bumps 23, and may be operated by a signal output from the second device substrate 40. Further, the transmitting acoustic wave resonator 20 is connected to the other surface of the first device substrate 30 through the bumps 26, and may be operated by the signal output from the first device substrate 30.

The receiving acoustic wave resonator 10 and the transmitting acoustic wave resonator 20 need to be spaced apart from each other by a certain distance or more in order to reduce RF signal interference. In this example, since a double-sided substrate is used, a sufficient distance between the resonators may be obtained, and a size of a product may be reduced.

Figure 4:
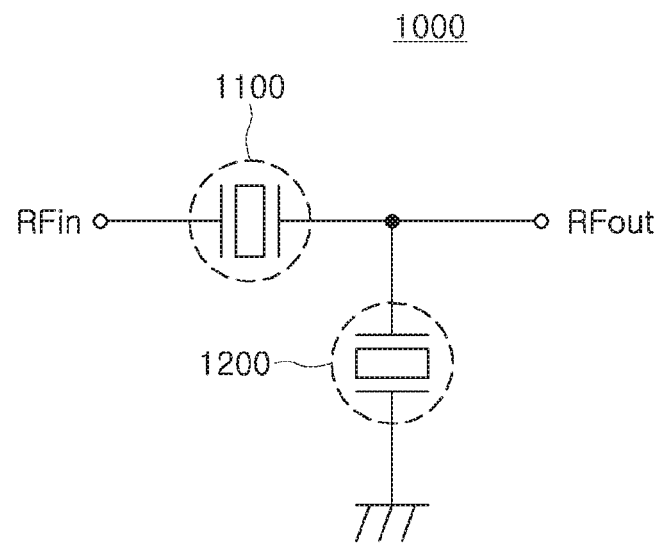
FIGS. 4 and 5 are schematic circuit diagrams of examples of filters including acoustic wave resonators.
Figure 5:
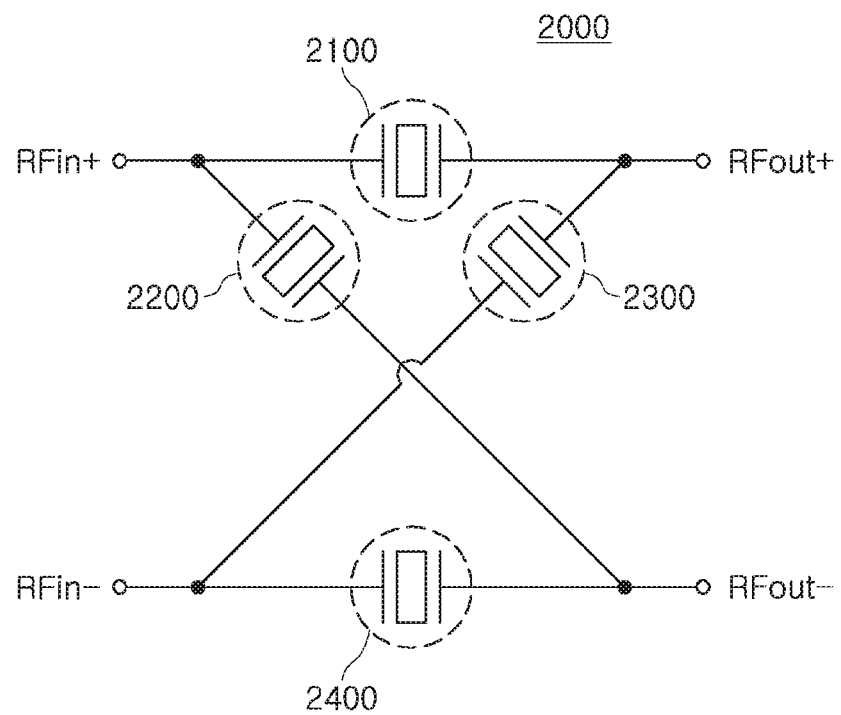

FIGS. 4 and 5 are schematic circuit diagrams of examples of filters including acoustic wave resonators.

Each of the filters of FIGS. 4 and 5 include a plurality of acoustic wave resonators that may be the acoustic wave resonator illustrated in FIG. 1.

Referring to FIG. 4, a filter 1000 has a ladder-type filter structure. Specifically, the filter 1000 includes two acoustic wave resonators 1100 and 1200.

A first acoustic wave resonator 1100 is connected in series between a signal input terminal to which an input signal RFin is input and a signal output terminal from which an output signal RFout is output, and a second acoustic wave resonator 1200 is connected between the signal output terminal and a ground.

Referring to FIG. 5, a filter 2000 has a lattice-type filter structure. Specifically, the filter 2000 includes four acoustic wave resonators 2100, 2200, 2300, and 2400 to filter balanced input signals RFin+ and RFin− and output balanced output signals RFout+ and RFout−.

The examples described above eliminate the need for a complicated circuit pattern connecting together different substrates disposed in a line on the same plane that is needed in the related art, and a number of components in a given substrate area may be increased.

Also, since a double-sided substrate is used in the examples described above, a sufficient distance between resonators may be obtained, and the size of the product may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave resonator comprising:
   a substrate;
   a resonating part disposed on a first surface of the substrate and comprising a first electrode, a piezoelectric layer, and a second electrode;
   a cap disposed on the first surface of the substrate and comprising an accommodating part accommodating the resonating part;
   a first connection pad disposed on the substrate; and
   a second connection pad disposed on the cap,
   wherein the resonating part is configured to be operated by a first signal from a device substrate disposed to face a second surface of the substrate opposite to the first surface of the substrate and input through the first connection pad and a second signal from a device substrate disposed on the cap and input through the second connection pad.

2. The acoustic wave resonator of claim 1, further comprising:
   a first connection pattern disposed on an inner surface of a first via hole penetrating through the substrate in a thickness direction of the substrate, the first connection pattern being connected to the first electrode; and
   a second connection pattern disposed on an inner surface of a second via hole penetrating through the substrate in the thickness direction of the substrate, the second connection pattern being connected to the second electrode,
   wherein the first connection pad comprises a first substrate connection pad connected to the first connection pattern and a second substrate connection pad connected to the second connection pattern.

3. The acoustic wave resonator of claim 2, wherein the device substrate disposed to face the second surface of the substrate is connected to the first substrate connection pad and the second substrate connection pad, and the device substrate disposed on the cap is connected to the second connection pad.

4. The acoustic wave resonator of claim 1, further comprising:
   a first connection electrode penetrating through the accommodating part and connected to the first electrode; and
   a second connection electrode penetrating through the accommodating part and connected to the second electrode,
   wherein the second connection pad comprises a first cap connection pad disposed on an outer surface of the cap and connected to the first connection electrode and a second cap connection pad disposed on the outer surface of the cap and connected to the second connection electrode.

5. The acoustic wave resonator of claim 4, wherein the device substrate disposed on the cap is connected to the first cap connection pad and the second cap connection pad, and is configured to output the second signal to the first cap connection pad or the second cap connection pad.

6. The acoustic wave resonator of claim 4, further comprising:
a first connection pattern disposed on an inner surface of a first via hole penetrating through the substrate in a thickness direction of the substrate; and
a second connection pattern disposed on an inner surface of a second via hole penetrating through the substrate in the thickness direction of the substrate,
wherein the first connection pad comprises a first substrate connection pad connected to the first connection pattern and a second substrate connection pad connected to the second connection pattern;
wherein the first connection electrode is directly connected to the first connection pattern; and
the second connection electrode is directly connected to the second connection pattern.

7. The acoustic wave resonator of claim 6, wherein the first cap connection pad, the first connection electrode, the first connection pattern, and the first substrate connection pad form a first signal connection channel between the device substrate disposed to face the second surface of the substrate and the device substrate disposed on the cap; and
the second cap connection pad, the second connection electrode, the second connection pattern, and the second substrate connection pad form a second signal connection channel between the device substrate disposed to face the second surface of the substrate and the device substrate disposed on the cap.

8. An acoustic wave resonator package comprising:
a receiving acoustic wave resonator and a transmitting acoustic wave resonator each comprising:
a substrate;
a resonating part disposed on a first surface of the substrate and comprising a first electrode, a piezoelectric layer, and a second electrode;
a cap disposed on the first surface of the substrate and comprising an accommodating part accommodating the resonating part; and
a substrate connection pad disposed on a second surface of the substrate on an opposite side of the substrate from the first surface of the substrate;
wherein the transmitting acoustic wave resonator further comprises a cap connection pad disposed on an outer surface of the cap;
a first device substrate having a first surface connected to the substrate connection pad of the receiving acoustic wave resonator, and a second surface connected to the cap connection pad of the transmitting acoustic wave resonator; and
a second device substrate having a surface connected to the substrate connection pad of the transmitting acoustic wave resonator.

9. The acoustic wave resonator package of claim 8, wherein the receiving acoustic wave resonator is configured to be operated by a signal output from the first device substrate to the substrate connection pad of the receiving acoustic wave resonator.

10. The acoustic wave resonator package of claim 8, wherein the transmitting acoustic wave resonator is configured to be operated by either one or both of a signal output from the first device substrate to the cap connection pad of the transmitting acoustic wave acoustic resonator and a signal output from the second device substrate to the substrate connection pad of the transmitting acoustic wave acoustic resonator.

11. The acoustic wave resonator package of claim 8, wherein the transmitting acoustic wave resonator is configured to operate as a signal connection channel between the first device substrate and the second device substrate.

12. An acoustic wave resonator comprising:
a substrate;
a resonating part disposed on a first surface of the substrate;
a cap disposed on the first surface of the substrate and covering the resonating part;
a cap connection pad disposed on the cap; and
a substrate connection pad disposed on a second surface of the substrate on second side of the substrate opposite from the first surface of the substrate,
wherein the resonating part is configured to be operated by a first signal output from a first device substrate disposed on the cap and input to the cap connection pad and a second signal output from a second device substrate disposed to face the second surface of the substrate and input to the substrate connection pad.

13. The acoustic wave resonator of claim 12, wherein the cap connection pad is disposed on a surface of the cap that is parallel to the first surface of the substrate; and
wherein the first device substrate is connected to the cap connection pad.

14. The acoustic wave resonator of claim 12, wherein the resonating part comprises a first electrode, a second electrode, and a piezoelectric element disposed between the first electrode and the second electrode; and
the substrate connection pad is connected to the first electrode or the second electrode.

15. The acoustic wave resonator of claim 14, wherein the cap connection pad is disposed on a surface of the cap that is parallel to the first surface of the substrate; and
wherein the first device substrate is connected to the cap connection pad.

16. The acoustic wave resonator of claim 15, wherein the first device substrate is mounted on the cap by a first bump between the cap connection pad and the first device substrate; and
the second device substrate is mounted on the substrate by a second bump between the substrate connection pad and the second device substrate.

* * * * *